United States Patent
Saha et al.

(10) Patent No.: US 8,704,520 B2
(45) Date of Patent: Apr. 22, 2014

(54) RADIO FREQUENCY COIL AND APPARATUS

(75) Inventors: Saikat Saha, Florence, SC (US);
Thomas Kwok-fah Foo, Clifton Park, NY (US); Bruce Courtney Campbell Amm, Clifton Park, NY (US);
Jean-Baptiste Mathieu, Clifton Park, NY (US); Robert Arvin Hedeen, Clifton Park, NY (US)

(73) Assignee: General Electric Company, Schenectady, NY (US)

( * ) Notice: Subject to any disclaimer, the term of this patent is extended or adjusted under 35 U.S.C. 154(b) by 362 days.

(21) Appl. No.: 12/963,217

(22) Filed: Dec. 8, 2010

(65) Prior Publication Data

US 2012/0146643 A1 Jun. 14, 2012

(51) Int. Cl.
*G01V 3/00* (2006.01)
(52) U.S. Cl.
USPC .......................................... 324/318
(58) Field of Classification Search
USPC ................................ 324/300–322
See application file for complete search history.

(56) References Cited

U.S. PATENT DOCUMENTS

| | | | | |
|---|---|---|---|---|
| 5,572,131 | A * | 11/1996 | Rzedzian | 324/318 |
| 6,661,229 | B2 * | 12/2003 | Weyers et al. | 324/318 |
| 7,525,313 | B2 | 4/2009 | Boskamp et al. | |
| 2004/0155656 | A1 * | 8/2004 | Leussler | 324/318 |
| 2005/0275403 | A1 | 12/2005 | Pinkerton et al. | |
| 2010/0033185 | A1 | 2/2010 | Saha et al. | |
| 2010/0102817 | A1 | 4/2010 | Saha | |
| 2010/0141258 | A1 * | 6/2010 | Saha | 324/318 |

OTHER PUBLICATIONS

New England Wire Technologies—Litz Wire, available 2010 at http://www.litzwire.com.*

* cited by examiner

*Primary Examiner* — Melissa Koval
*Assistant Examiner* — Daniel Miller
(74) *Attorney, Agent, or Firm* — The Small Patent Law Group; Dean D. Small

(57) ABSTRACT

A radio frequency (RF) coil for a magnetic resonance imaging (MRI) system includes a first end ring, a second end ring, and a plurality of rungs electrically coupled between the first and second end rings, each rung including a first rung portion formed from a plurality of conductors and a second rung portion formed from a single solid conductor. A resonance assembly for a magnetic resonance imaging (MRI) system and an MRI imaging system are also described herein.

20 Claims, 6 Drawing Sheets

RADIO FREQUENCY COIL AND APPARATUS

BACKGROUND OF THE INVENTION

The subject matter disclosed herein relates generally to the Magnetic Resonance Imaging (MRI) systems, and more particularly to a Radio Frequency (RF) coil for MRI systems.

MRI is a medical imaging modality that generates images of the inside of a human body without using x-rays or other ionizing radiation. MRI uses a magnet to create a strong, uniform, static magnetic field (i.e., the "main magnetic field") and gradient coils to produce smaller amplitude, spatially varying magnetic fields when a current is applied to the gradient coils. When a human body, or part of a human body, is placed in the main magnetic field, the nuclear spins that are associated with hydrogen nuclei in tissue water become polarized. The magnetic moments that are associated with these spins become preferentially aligned along the direction of the main magnetic field, resulting in a small net tissue magnetization along that axis (the "z axis," by convention) and the gradient coils encode the MR signal.

Radio frequency (RF) coils are used to create pulses of RF energy at or near the resonance frequency of the hydrogen nuclei. These RF coils are used to transmit RF excitation signals and receive MR signals used to form the images. Various types of RF coils may be used in an MRI system such as a whole-body RF coil and RF surface (or local) coils. Two common RF coil configurations are the birdcage coil and the transverse electromagnetic (TEM) coil. During an MRI scan, acoustic noise and vibration can be generated in the patient bore of the MRI system. The acoustic noise and vibration can be uncomfortable and potentially harmful to both the patient and scanner operator. There are several sources of acoustic noise in an MRI system including the gradient coils and the RF coils. The acoustic noise generated by the RF coil is typically caused by eddy currents induced in the RF coil conductors by operation of the gradient coils. In particular, current pulses are applied (e.g., as part of a pulse sequence) to the gradient coils to generate time-varying magnetic fields. These time-varying magnetic fields can induce eddy currents in an RF coil that cause motion or vibration of the RF coil and result in acoustic noise. In addition, the eddy currents induced in the RF coils can produce heat. The heat produced by the RF coils may cause an increase in the temperature of the patient bore which can affect patient comfort and the efficiency of the MRI system.

BRIEF DESCRIPTION OF THE INVENTION

In one embodiment, a radio frequency (RF) coil for a magnetic resonance imaging (MRI) system is provided. The RF coil includes a first end ring, a second end ring, and a plurality of rungs electrically coupled between the first and second end rings, each rung including a first rung portion formed from a plurality of conductors and a second rung portion formed from a single solid conductor.

In another embodiment, a radio frequency (RF) coil for a magnetic resonance imaging (MRI) system is provided. The RF coil includes a first end ring, a second end ring, and a plurality of rungs electrically coupled between the first and second end rings. At least one of the rungs includes a multi-conductor assembly and a solid conductor coupled in series to the multi-conductor assembly, the multi-conductor assembly partially extending along a length of the rung, the multi-conductor assembly including a plurality of individual conductors that are braided together to form the multi-conductor assembly.

In a further embodiment, a Magnetic Resonance Imaging (MRI) system is provided. The MRI imaging system includes a superconducting magnet installed in a cryostat, a gradient coil assembly disposed within an inner diameter of the superconducting magnet, and a radio frequency (RF) coil disposed within an inner diameter of the gradient coil assembly. The RF coil includes a first end ring, a second end ring, and a plurality of rungs electrically coupled between the first and second end rings, each rung including a first rung portion formed from a plurality of conductors and a second rung portion formed from a single solid conductor.

DETAILED DESCRIPTION OF THE INVENTION

Figure 1:
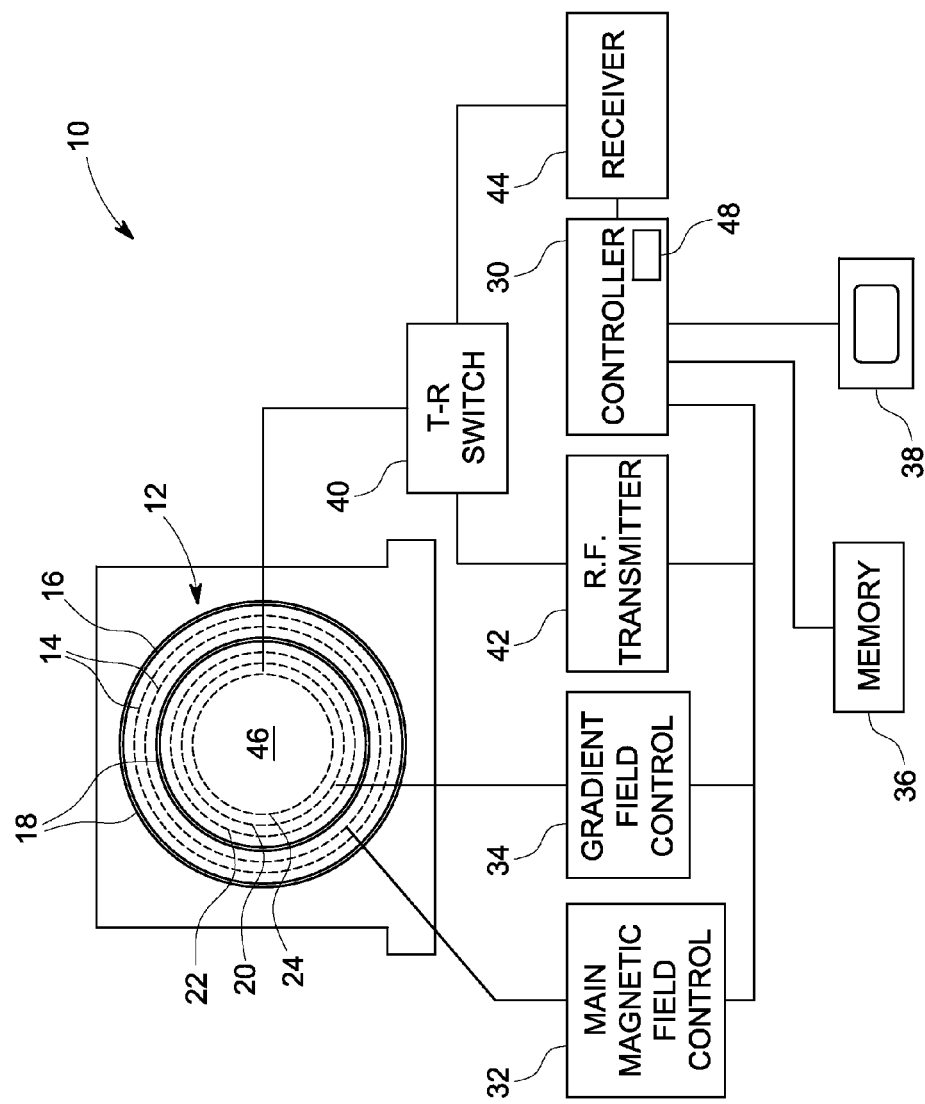
FIG. 1 is a schematic block illustration of an exemplary imaging system formed in accordance with various embodiments.

Embodiments of the invention will be better understood when read in conjunction with the appended drawings. To the extent that the figures illustrate diagrams of the functional blocks of various embodiments, the functional blocks are not necessarily indicative of the division between hardware circuitry. Thus, for example, one or more of the functional blocks (e.g., processors, controllers or memories) may be implemented in a single piece of hardware (e.g., a general purpose signal processor or random access memory, hard disk, or the like) or multiple pieces of hardware. Similarly, the programs may be stand alone programs, may be incorporated as subroutines in an operating system, may be functions in an installed software package, and the like. It should be understood that the various embodiments are not limited to the arrangements and instrumentality shown in the drawings.

As used herein, an element or step recited in the singular and proceeded with the word "a" or "an" should be understood as not excluding plural of said elements or steps, unless such exclusion is explicitly stated. Furthermore, references to "one embodiment" are not intended to be interpreted as excluding the existence of additional embodiments that also incorporate the recited features. Moreover, unless explicitly stated to the contrary, embodiments "comprising" or "having" an element or a plurality of elements having a particular property may include additional such elements not having that property.

Various embodiments of Radio Frequency (RF) coil and methods described herein may be provided as part of, or used with, a medical imaging system, such as an imaging system 10 as shown in FIG. 1. The RF coil includes a plurality rungs, or conductive elements, wherein each rung includes a further portion fabricated from a plurality of individually insulated wires and a second portion that forms a solid conductor. In at least some embodiments, the plurality of rungs enable a more uniform current distribution along the width of each rung that in turn produces a more uniform magnetic field $B_1$. A more uniform magnetic field $B_1$ is particularly useful for imaging applications at high fields.

It should be appreciated that although the imaging system 10 is illustrated as a single modality imaging system, the various embodiments may be implemented in or with multi-modality imaging systems. For example, the imaging system 10 is illustrated as a Magnetic Resonance Imaging (MRI) system and may be combined with different types of medical imaging systems, such as a Computed Tomography (CT), Positron Emission Tomography (PET), a Single Photon Emission Computed Tomography (SPECT), as well as an ultrasound system, or any other system capable of generating images, particularly of a human. Moreover, the various embodiments are not limited to medical imaging systems for imaging human subjects, but may include veterinary or non-medical systems for imaging non-human objects, luggage, etc.

In the exemplary embodiment, the imaging system 10 includes a superconducting magnet assembly 12 that includes a superconducting magnet 14. The superconducting magnet 14 is formed from a plurality of magnetic coils supported on a magnet coil support or coil former. In one embodiment, the superconducting magnet assembly 12 may also include a thermal shield 16. A vessel 18 (also referred to as a cryostat) surrounds the superconducting magnet 14, and the thermal shield 16 surrounds the vessel 18. The vessel 18 is typically filled with liquid helium to cool the coils of the superconducting magnet 14. A thermal insulation (not shown) may be provided surrounding the outer surface of the vessel 18. The imaging system 10 also includes a main gradient coil 20, a shield gradient coil 22, and an RF transmit coil 24. The imaging system 10 also generally includes a controller 30, a main magnetic field control 32, a gradient field control 34, a memory 36, a display device 38, a transmit-receive (T-R) switch 40, an RF transmitter 42 and a receiver 44.

In operation, a body of an object, such as a patient (not shown), or a phantom to be imaged, is placed in a bore 46 on a suitable support, for example, a motorized table (not shown) or other patient table. The superconducting magnet 14 produces a uniform and static main magnetic field $B_1$ across the bore 46. The strength of the electromagnetic field in the bore 46 and correspondingly in the patient, is controlled by the controller 30 via the main magnetic field control 32, which also controls a supply of energizing current to the superconducting magnet 14.

The main gradient coil 20, which may include one or more gradient coil elements, is provided so that a magnetic gradient can be imposed on the magnetic field $B_1$ in the bore 46 in any one or more of three orthogonal directions x, y, and z. The main gradient coil 20 is energized by the gradient field control 34 and is also controlled by the controller 30.

The RF transmit coil 24, which may include a plurality of coils (e.g., resonant surface coils), is arranged to transmit magnetic pulses and/or optionally simultaneously detect MR signals from the patient, if receive coil elements are also provided. The RF transmit coil 24 and a receive surface coil, if provided, may be selectably interconnected to one of the RF transmitter 42 or receiver 44, respectively, by the T-R switch 40. The RF transmitter 42 and T-R switch 40 are controlled by the controller 30 such that RF field pulses or signals are generated by the RF transmitter 42 and selectively applied to the patient for excitation of magnetic resonance in the patient.

Following application of the RF pulses, the T-R switch 40 is again actuated to decouple the RF transmit coil 24 from the RF transmitter 42. The detected MR signals are in turn communicated to the controller 30. The controller 30 includes a processor 48 that controls the processing of the MR signals to produce signals representative of an image of the patient. The processed signals representative of the image are also transmitted to the display device 38 to provide a visual display of the image. Specifically, the MR signals fill or form a k-space that is Fourier transformed to obtain a viewable image which may be viewed on the display device 38.

Figure 2:
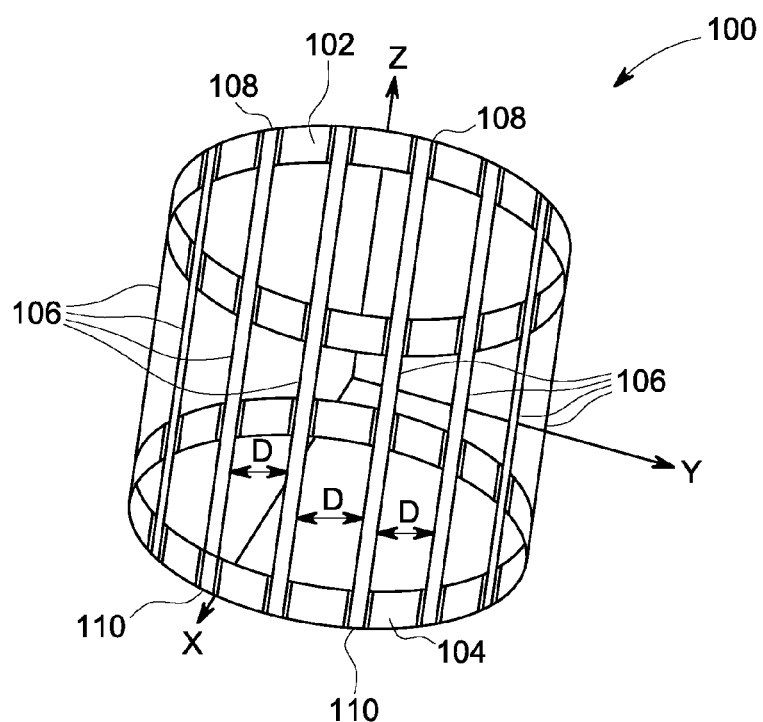
FIG. 2 is a perspective view of an exemplary RF coil formed in accordance with various embodiments.

As mentioned above, RF coils (for example, RF coil 24) may be used to transmit RF excitation pulses to generate an excitation field, $B_1$, and/or to receive MR signals. FIG. 2 is a perspective view of an exemplary RF coil 100 formed in accordance with various embodiments that may be used with the imaging system 10 shown in FIG. 1. Various embodiments may be used to form different coil configurations such as birdcage coils, transverse electromagnetic (TEM) coils, whole-body coils, and/or surface, or local, coils and for transmitting and/or receiving signals. Thus, while the exemplary embodiment is illustrated in a birdcage configuration, it should be realized that the exemplary rungs described herein may be used in other coil configurations using rungs.

Referring to FIG. 2, the RF coil 100 includes a first end ring 102, a second end ring 104 and a plurality of rungs 106 that are electrically coupled between the first and second end rings 102 and 104, respectively. Each of the plurality of rungs 106 includes a first end 108 and a second opposite end 110. In the exemplary embodiment, the first end 108 of each rung 106 is electrically coupled to the first end ring 102 and the second end 110 of each rung 106 is electrically coupled to the second end ring 104. The rungs 106 may be coupled to each of the end rings 102 and 104 using, for example, a soldering procedure. Optionally, the rungs 106 may be coupled to each of the end rings 102 and 104 using, for example, an electrically conductive adhesive.

As shown in FIG. 2, the first end ring 102 and the second end ring 104 oppose one another in a spaced-apart relationship and are connected by the plurality of rungs 106 such that the RF coil 100 is cylindrical in shape with annular ends and is compatible with the above-described imaging system 10.

In the exemplary embodiment, the RF coil 100 includes N rungs 106 which are radially separated from each other by a distance D. Thus, the rungs 106 are arranged circumferentially around the end rings 102 and 104 and are, in the exemplary embodiment, uniformly spaced apart from one another. It should be realized that the RF coil 100 may have fewer or more rungs 106 than the illustrated embodiment. The quantity of rungs 106 may be selected based on the requirements of a particular imaging application. For example, the quantity of rungs 106 may be selected based on a desired field-of-view (FOV), a desired image resolution, a desired power requirement and/or a desired imaging speed.

In the exemplary embodiment, each rung 106 includes a plurality of capacitors (not shown). The capacitors may be, for example, low inductance end ring capacitors, that electrically connect the rungs 106 together. The rungs 106 may be constructed from a material having high electrical conductivity, such as, for example, copper.

The RF coil 100 shown in FIG. 2 may be used as a whole-body RF coil or as a surface (or local) coil such as a head coil. For a whole-body RF coil, the dimensions of the RF coil 100 are configured so that the RF coil 100 can be mounted inside the superconducting magnet assembly 12 shown in FIG. 1. For a surface or local coil (e.g., a head coil), the dimensions of RF coil 100 are configured so that the RF coil 100 can be disposed within the bore 46, also shown in FIG. 1.

Figure 3:
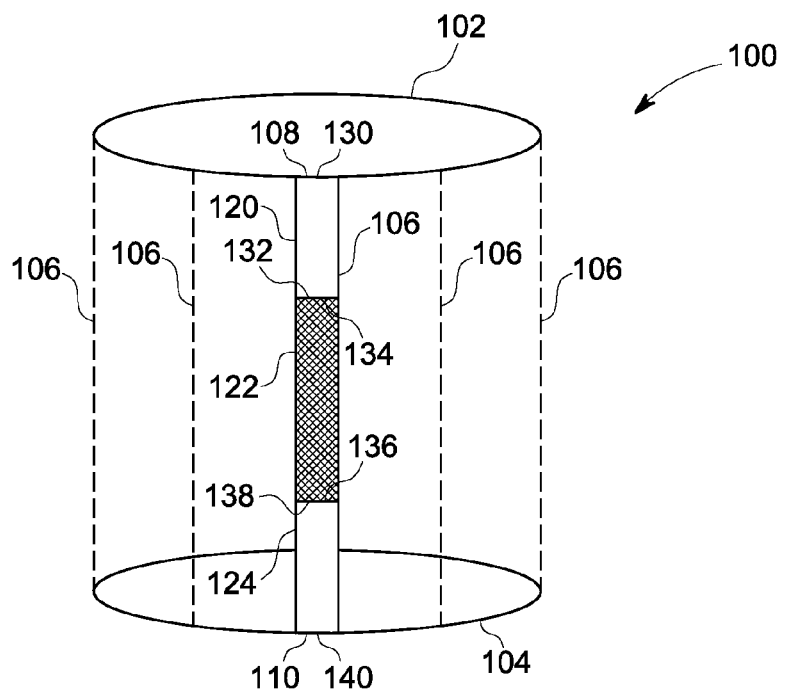
FIG. 3 is a simplified perspective view of the RF coil shown in FIG. 2 in accordance with various embodiments.

FIG. 3 is a simplified perspective view of the RF coil 100 shown in FIG. 2. As discussed above, the RF coil 100 includes the first end ring 102, the second end ring 104, and the plurality of rungs 106. In the exemplary embodiment, each rung 106 includes a first rung portion 120, a second rung portion 122, and a third rung portion 124 that are coupled together in electrical series. In the exemplary embodiment, the second rung portion 122 is electrically coupled between the first rung portion 120 and the third rung portion 124 such that the combination of the first, second, and third rung portions 120, 122, and 124 form a single continuous electrical conductor, also referred to herein as the rung 106. The first rung portion 120, the second rung portion 122, and the third rung portion 124 may be coupled together using, for example, a soldering procedure and/or an electrically conductive adhesive. It should be realized that the quantity, size, and locations of the rung portions utilized to form the rung 106, in some embodiments, is selected to reduce or minimize eddy currents and thereby reduce acoustic vibrations and noise, as well as increase or maximize the RF performance of the coil 100.

Referring again to FIG. 3, the first rung portion 120 includes a first end 130 and a second opposing end 132. The second rung portion 122 includes a first end 134 and a second opposing end 136. Additionally, the third rung portion 124 includes a first end 138 and a second opposing end 140. To form the exemplary rung 106 discussed above, the first end 130 of the first rung portion 120 is electrically coupled to the first end ring 102 using a solder or adhesive as discussed above. Thus, the first end 130 of the first rung portion 120 also forms the first end 108 of the rung 106. The second end 132 of the first rung portion 120 is electrically coupled to the first end 134 of the second rung portion 122. The second end 136 of the second rung portion 122 is electrically coupled to the first end 138 of the third rung portion 124. Additionally, the second end 140 of the third rung portion 124 is electrically coupled to the second end ring 104. Thus, the second end 140 of the third rung portion 124 also forms the second end 110 of the rung 106.

Figure 4:
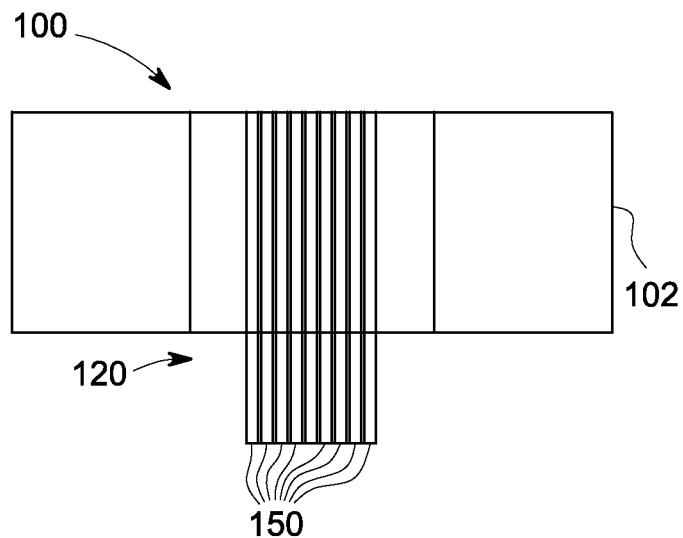
FIG. 4 is a front view of a portion of the RF coil shown in FIGS. 2 and 3 formed in accordance with various embodiments.

FIG. 4 illustrates a front view of a portion of the first rung portion 120 shown in FIGS. 2 and 3. In the exemplary embodiment, the first rung portion 120 includes at least one multi-conductor assembly 150. Optionally, the first rung portion 120 may include a single multi-conductor assembly 150. In the exemplary embodiment, the multi-conductor assemblies 150 may be arranged in a ribbon cable type arrangement as shown in FIG. 4. It should be realized that although FIG. 4 is used to describe the first rung portion 120, the third rung portion 124 may be formed substantially similar to the first rung portion 120. The quantity and length of the multi-conductor assemblies 150, and the diameter of the individual conductors within the multi-conductor assemblies 150, forming the first and third rung portions 120 and 124 is selected based on the desired frequency to be produced by the RF coil 100 shown in FIGS. 2 and 3. For example, the multi-conductor assembly 150 may have a smaller diameter for larger excitation frequencies and a larger diameter for smaller excitation frequencies. In the exemplary embodiment, the plurality of conductor assemblies 150 are positioned parallel to each other such that the first rung portion 120 is substantially planar. Optionally, at least some of the multi-conductor assemblies 150 may be placed in a bundled type arrangement.

Figure 5:
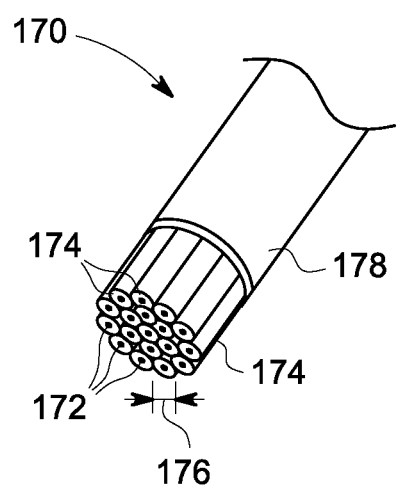
FIG. 5 is a top perspective view of an exemplary conductor assembly formed in accordance with various embodiments.

FIG. 5 is a top perspective view of an exemplary multi-conductor assembly 170 that may be used instead of at least one of the multi-conductor assemblies 150 shown in FIG. 4. As shown in FIG. 5, the conductor assembly 170 has a circular cross sectional profile. The conductor assembly 170 also includes a plurality of individual wire conductors 172 each having substantially the same length. The wire conductors 172 are each surrounded by an electrical insulation material 174. In this exemplary embodiment, the wire conductors 172 each have an outer diameter 176 that is selected based on the desired frequency to be produced by the RF coil 100 as discussed above. The conductor assembly 170 may also include an outer insulation layer 178 that is configured to encase the plurality of insulated wire conductors 172 to maintain the wire conductors 172 in a relatively fixed position with respect to each other. The wire conductors 172 are formed from a high electrical conductivity material such as copper or silver, for example. Moreover, the insulation material 174 is selected to withstand high breakdown voltages. In this embodiment, the wire conductors 172 are configured in a parallel arrangement such that the conductors 170 run parallel to each other along the length of the conductor assembly 170.

Figure 6:
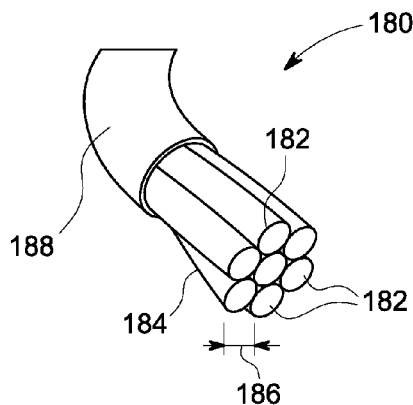
FIG. 6 is a top perspective view of another exemplary conductor assembly formed in accordance with various embodiments.

FIG. 6 is a top perspective view of an exemplary multi-conductor assembly 180 that may be used instead of at least one of the conductor assemblies 150 shown in FIG. 4. As shown in FIG. 6, the conductor assembly 180 has a circular cross sectional profile. The conductor assembly 180 also includes a plurality of wire conductors 182 each having substantially the same length. The wires conductors 182 are each surrounded by an electrical insulation material 184. In this embodiment, the wire conductors 182 each have an outer diameter 186 that is selected based on the desired frequency to be produced by the RF coil 100 as discussed above. The conductor assembly 180 may also include an outer insulation layer 188 that is configured to encase the plurality of insulated wire conductors 182 to maintain the wire conductors 182 in a relatively fixed position with respect to each other. The wire conductors 182 are formed from a high electrical conductivity material such as copper or silver, for example. Moreover, the insulation material 184 is selected to withstand high breakdown voltages. In this embodiment, the wire conductors 182 are also woven, twisted or braided together to form the electrical conductor assembly 180. Specifically, the plurality of individual wire conductors 182 are bent or formed such that the shape of each wire conductor 182 forms a spiral. Moreover, individual spirals are interwoven, or weaved, with each other to form the conductor assembly 180.

Figure 7:
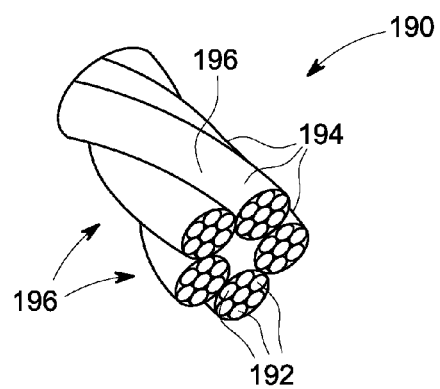
FIG. 7 is a top perspective view of another exemplary conductor assembly formed in accordance with various embodiments.

FIG. 7 is a top perspective view of an exemplary multi-conductor assembly 190 that may be used instead of at least one of the conductor assemblies 150 shown in FIG. 4. As shown in FIG. 7, the conductor assembly 190 has a circular cross sectional profile. The conductor assembly 190 also includes a plurality of wire conductors 192 each having substantially the same length. The wires conductors 192 are each surrounded by an electrical insulation material 194. In this embodiment, the wire conductors 192 each have an outer diameter that is selected based on the desired frequency to be produced by the RF coil 100 as discussed above. In this embodiment, the wire conductors 192 are also woven, twisted or braided together to form a wire bundle 196. A plurality of wire bundles 196 are then woven, twisted or braided together to form the conductor assembly 190. Specifically, the wire bundles 196 are bent so that the shape of each wire bundle 196 forms a spiral. Moreover, individual spiral wound wire bundles 196 are interwoven, or weaved, with each other to form the conductor assembly 190. The conductor assembly 190 may also include an outer insulation layer 198 that is configured to encase the plurality of insulated wire bundles 196 to maintain the wire bundles 196 in a relatively fixed position with respect to each other.

Figure 8:
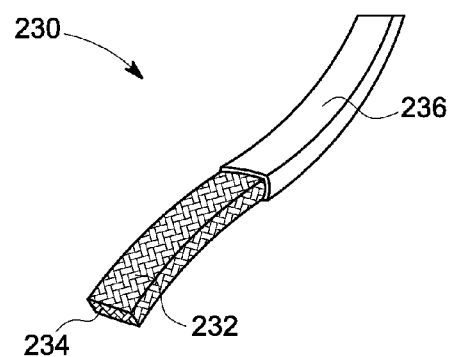
FIG. 8 is a top perspective view of another exemplary conductor assembly formed in accordance with various embodiments.

FIG. 8 is a top perspective view of an exemplary multi-conductor assembly 230 that may be used instead of at least one of the conductor assemblies 150 shown in FIG. 4. As shown in FIG. 8, the conductor assembly 230 has a rectangular cross sectional profile. The conductor assembly 230 also includes a plurality of wire conductors 232 each having substantially the same length. The wires conductors 232 are each surrounded by an electrical insulation material 234. In this embodiment, the wire conductors 232 each have an outer diameter that is selected based on the desired frequency to be produced by the RF coil 100 as discussed above. The conductor assembly 230 may also include an outer insulation layer 236 that is configured to encase the plurality of insulated wire conductors 232 to maintain the wire conductors 232 in a relatively fixed position with respect to each other. The wire conductors 232 are formed from a high electrical conductivity material such as copper or silver, for example. Moreover, the insulation material 236 is selected to withstand high breakdown voltages. In this embodiment, the wire conductors 232 are also woven, twisted or braided together to form the rectangular profile.

Figure 9:
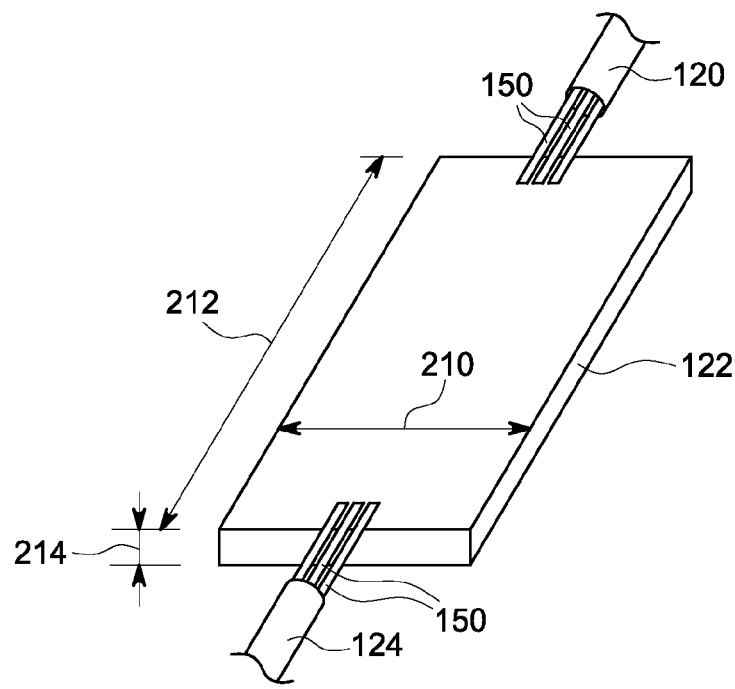
FIG. 9 is a top perspective view of another exemplary conductor assembly formed in accordance with various embodiments.

FIG. 9 is top perspective view of the second rung portion 122 also shown in FIG. 3. As discussed above, in the exemplary embodiment, the second rung portion 122 is a single or unitary electrical conductor that is fabricated from a single piece of conductive material. The second rung portion 122 may be fabricated from, for example, a copper material. In the exemplary embodiment, the second rung portion 122 has a substantially rectangular shape and includes a width 210, a length 212, and a thickness 214. The width 210, the length 212, and the thickness 214 of the second rung portion 122 is selected based on the desired frequency to be produced by the RF coil 100 shown in FIGS. 2 and 3. For example, lower frequencies require a smaller volume, e.g. smaller, width, length, or width, and higher frequencies require a larger volume. It should be realized that although FIG. 8 illustrates the second rung portion 122 formed as a rectangular shape, that other shapes may be utilized.

Figure 10:
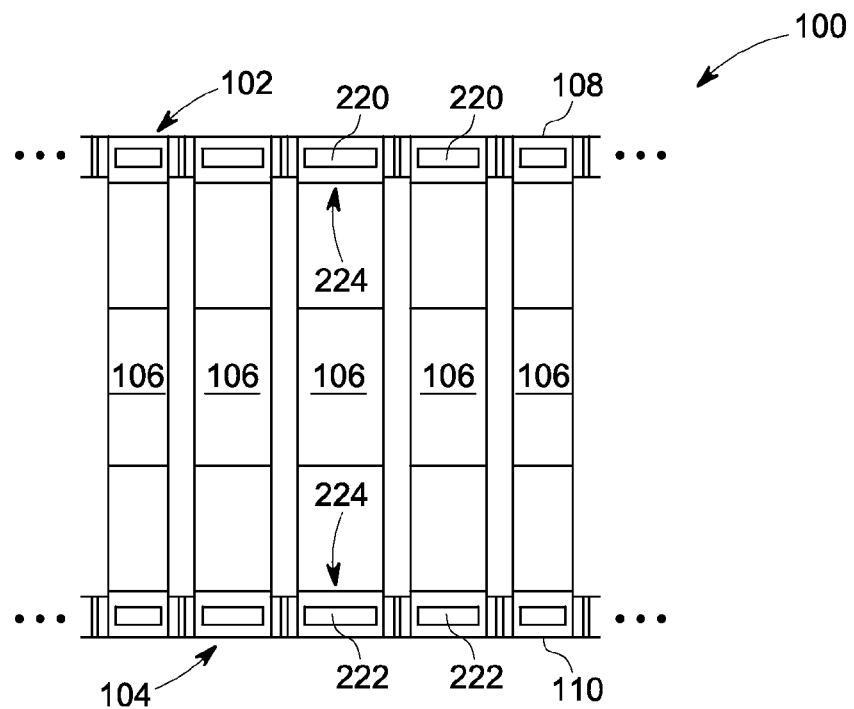
FIG. 10 is a plan view of the exemplary RF coil shown in FIGS. 2 and 3 formed in accordance with various embodiments.

FIG. 10 is a simplified plan view of the RF coil 100 shown in FIG. 2. As discussed above, the RF coil 100 includes the first end ring 102, the second end ring 104, and the plurality of rungs 106. In the exemplary embodiment, each rung 106 also includes a pair openings or cutouts 220 and 222. In operation, the openings 220 and 222 facilitate reducing or minimizing eddy currents. Therefore, the pair of openings 220 and 222 also reduce acoustic vibrations and noise as a result of the reduced eddy currents and can increase or maximize RF performance of the coil 100.

Accordingly, to reduce eddy currents, the pair of openings 220 and 222 are located at regions (or areas) 224 where the rungs 106 meet the first and second end rings 102 and 104, respectively. In the embodiment shown in FIG. 10, each rung 106 has the rung opening 220 that is located at the first end 108 of the rung 106 and the second rung opening 222 that is located at the second end 110 of the rung 106. The rung openings 220 and 222 may be formed by removing material (e.g., copper) from the rung 106, for example. The pair of rung openings 220 and 222 preferably have a rectangular shape as shown in FIG. 10. Optionally, the pair of rung openings 220 and 222 may have any shape that facilitates reducing eddy currents. For example, the pair or rung openings 220 and 222 may have a U-shape. However, it should be realized that various embodiments described herein form RF coils that do not include the openings shown in FIG. 10.

Figure 11:
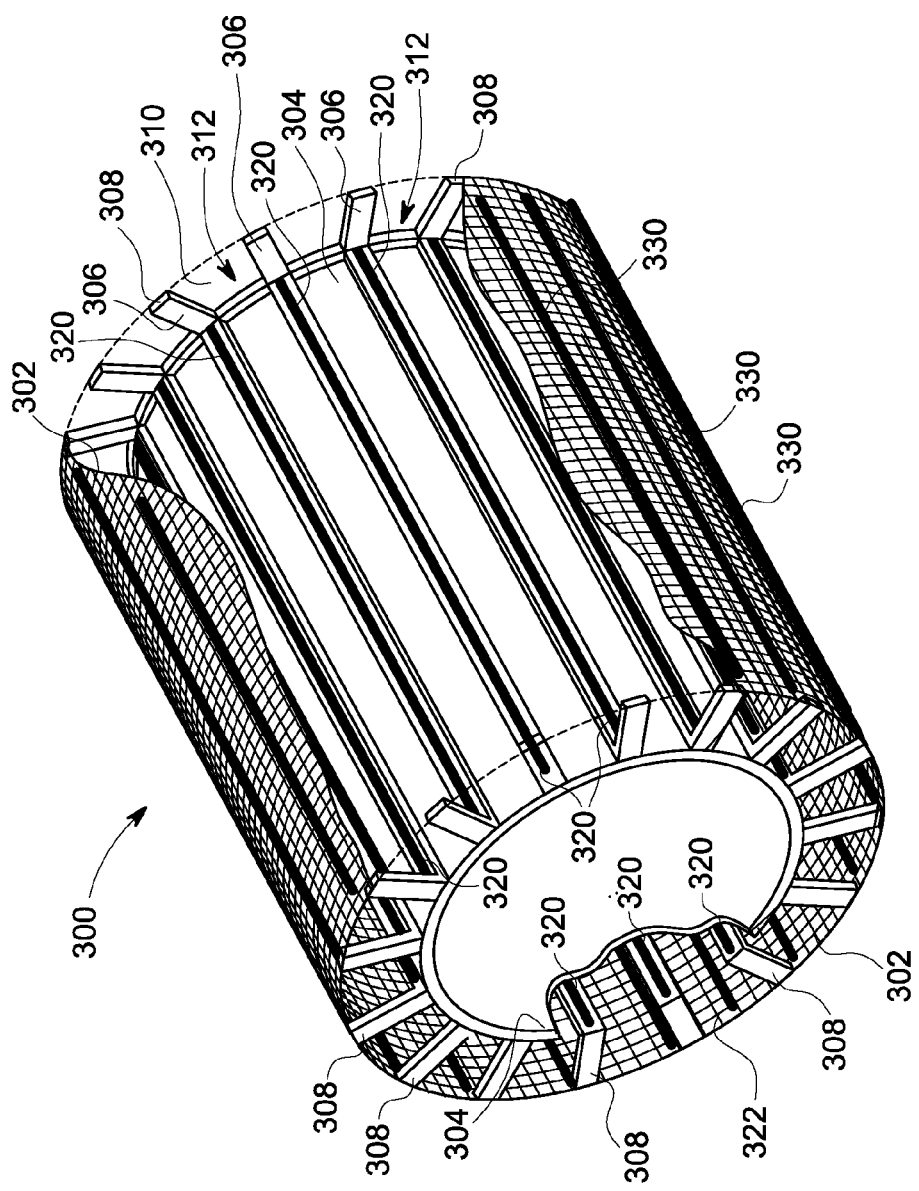
FIG. 11 is another exemplary RF coil assembly formed in accordance with various embodiments.

FIG. 11 is another exemplary RF coil assembly 300 that may be fabricated to include any of the multi-conductor assemblies described herein. In the exemplary embodiment, the RF coil assembly 300 is arranged as a transverse electromagnetic (TEM) coil assembly. Therefore, the RF coil assembly 300 includes an outer RF shield 302, surrounding a hollow cylindrical structure or frame 304. The RF shield 302 may be formed of a copper mesh or other conductive materials suitable for shielding RF transmissions. The RF shield 302 of the RF coil assembly 300 is shown in partial cut-away to reveal three coil elements 306. As arranged, the RF coil assembly 300 has a total of sixteen coil elements 306 spaced evenly about the circumference of the frame 304. However, it is to be understood that various configurations of the RF coil assembly 300 may have any number of coil elements 306.

As can be seen from the depiction of the coil elements 306, the coil elements 306 are laid out lengthwise as conductive segments along the primary axis of the frame 304. In one embodiment, the coil elements 306 are copper strips having widths of approximately 1.25 inches and lengths of approximately 460 mm. However, it is should be appreciated that similar widths and lengths may equivalently achieve the advantages discussed herein when the coil elements 306 are evenly spaced about frame 304.

The coil elements 306 are each in electrical communication with the common RF shield 392 via connectors 308 located at the ends of the coil elements 306. Thus, the RF shield 302 may act as a current return path when the coil elements 302 are being used for RF transmission. On one end ring 310 of coil assembly 300, a decoupling element 312 is attached between each coil element 306. As will be explained below, decoupling neighboring coil elements 306 provides for improved control over transmissions from each coil element.

In the exemplary embodiment, the TEM coil 300 also includes a plurality of multi-conductor assemblies 320. The multi-conductor assemblies 300 may be embodied as any of the multi-conductor assemblies described herein. In the exemplary embodiment, a single multi-conductor assembly 320 is formed or patterned on each of the coil elements 306 and extend between the end ring 310 and an opposing end ring 322. In another embodiment, the outer RF shield 302 may also be fabricated to include at least one multi-conductor assembly 330. In the exemplary embodiment, the outer RF shield 302 includes a plurality of multi-conductor assemblies 330 that extend from the end ring 310 to the end ring 322 and are spaced approximately equidistantly around an outer surface of the outer RF shield 302. In the exemplary embodiment, the multi-conductor assemblies 330 may be embodied as any of the multi-conductor assemblies described herein and are sized and positioned to maintain both aximuthal and longitudinal conductivity.

Described herein is an exemplary RF coil that includes a plurality of rungs. Each rung includes a plurality of rung portions. At least one of the rung portions is a single unitary conductor. At least one of the rung portions is formed from a plurality of individual electrical conductors. Each electrical conductor has a circular cross section and an insulating material disposed around an outside surface of the conductor. In operation, the RF coil facilitates reducing the eddy currents produced on each rung. As a result, heating, vibration and/or acoustic noise generated by the RF coil may also reduced. Moreover, the RF coil may provide a more uniform current distribution along the width of each rung that in turn produces a more uniform excitation field. Additionally, the RF coil effectively reduces acoustic noise generation directly at the location where the noise is produced, i.e. at the ends of the rungs and therefore may improve patient, hospital technician and physician experience and also may reduce the need for installing additional acoustic insulation material in the room.

It is to be understood that the above description is intended to be illustrative, and not restrictive. For example, the above-described embodiments (and/or aspects thereof) may be used in combination with each other. In addition, many modifications may be made to adapt a particular situation or material to the teachings of the various embodiments without departing from their scope. While the dimensions and types of materials described herein are intended to define the parameters of the various embodiments, they are by no means limiting and are merely exemplary. Many other embodiments will be apparent to those of skill in the art upon reviewing the above description. The scope of the various embodiments should, therefore, be determined with reference to the appended claims, along with the full scope of equivalents to which such claims are entitled. In the appended claims, the terms "including" and "in which" are used as the plain-English equivalents of the respective terms "comprising" and "wherein." Moreover, in the following claims, the terms "first," "second," and "third," etc. are used merely as labels, and are not intended to impose numerical requirements on their objects. Further, the limitations of the following claims are not written in means-plus-function format and are not intended to be interpreted based on 35 U.S.C. §112, sixth paragraph, unless and until such claim limitations expressly use the phrase "means for" followed by a statement of function void of further structure.

This written description uses examples to disclose the various embodiments, including the best mode, and also to enable any person skilled in the art to practice the various embodiments, including making and using any devices or systems and performing any incorporated methods. The patentable scope of the various embodiments is defined by the claims, and may include other examples that occur to those skilled in the art. Such other examples are intended to be within the scope of the claims if the examples have structural elements that do not differ from the literal language of the claims, or if the examples include equivalent structural elements with insubstantial differences from the literal languages of the claims.

What is claimed is:

1. A radio frequency (RF) coil for a magnetic resonance imaging (MRI) system, the RF coil comprising:
    a first end ring;
    a second end ring; and
    a plurality of rungs electrically coupled between the first and second end rings, each rung including a first rung portion and a second rung portion, the first rung portion comprising a multi-conductor assembly including plural wire conductors, the wire conductors individually encased along a length by a first portion of electrical insulation material wherein the wire conductors are electrically insulated from each other, the second rung portion formed from a single solid conductor and coupled in electrical series with the first rung portion;
    wherein each rung further comprises a third rung portion formed from a plurality of wire conductors, the second rung portion being coupled in electrical series between the first and third rung portions, the wire conductors of the third rung portion individually encased along a length by a second portion of electrical insulation material wherein the wire conductors are electrically insulated from each other.

2. The RF coil of claim 1 wherein the wire conductors of the multi-conductor assembly of the first rung portion are braided together to form the first rung portion.

3. The RF coil of claim 1 wherein the first rung portion comprises plural wire bundles braided together, each wire bundle formed from a bundled group of wire conductors of the multi-conductor assembly.

4. The RF coil of claim 1 wherein a group of the wire conductors of the multi-conductor assembly are braided together to form a wire bundle, a plurality of wire bundles being braided together to form the first rung portion.

5. The RF coil of claim 1 wherein the wire conductors each have a circular cross sectional profile.

6. The RF coil of claim 1 wherein each of the wire conductors has an outer diameter that is selected based on a desired Radio Frequency (RF) coil operational frequency.

7. The RF coil of claim 1 wherein the first end ring, the second end ring, and the plurality of rungs are coupled together to form a birdcage coil.

8. The RF coil of claim 1 wherein the RF coil is at least one of a Transverse Electromagnetic (TEM) coil, a whole body coil, or a local coil.

9. The RF coil of claim 1 wherein each rung further comprises a first opening located in proximity to the first end ring and a second opening located in proximity to the second end ring.

10. The RF coil of claim 1 wherein the first rung portion includes an outer insulation layer to encase the wire conductors and maintain the wire conductors in a fixed position with respect to each other.

11. The RF coil of claim 1 wherein the wire conductors are coupled together to form a ribbon cable.

12. The RF coil of claim 1 wherein at least one of a quantity or a length of the wire conductors is selected based on an operating frequency of the RF coil.

13. A radio frequency (RF) coil for a magnetic resonance imaging (MRI) system, the RF coil comprising:
    a first end ring;
    a second end ring; and
    a plurality of rungs electrically coupled between the first and second end rings, at least one of the rungs including a multi-conductor assembly and a solid conductor coupled in series to the multi-conductor assembly, the multi-conductor assembly partially extending along a length of the rung, the multi-conductor assembly including a plurality of insulated conductors that are braided together to form the multi-conductor assembly, the insulated conductors individually encased along a length by a first portion of electrical insulation material wherein the insulated conductors are electrically insulated from each other;
    wherein at least one of the rungs further comprises a second multi-conductor assembly that is coupled in series with the solid conductor, the second multi-conductor assembly including a plurality of insulated conductors individually encased along a length by a second portion of electrical insulation material that are braided together to form the second multi-conductor assembly, the solid conductor being coupled between the multi-conductor assemblies.

14. The RF coil of claim 13 wherein each of the plurality of insulated conductors has an outer diameter that is selected based on a desired RF coil operational frequency.

15. The RF coil of claim 13 wherein the plurality of insulated conductors are braided together to form a wire bundle, a plurality of wire bundles being braided together to form the multi-conductor assembly.

16. The RF coil of claim 13 wherein each rung further comprises a first opening located in proximity to the first end ring and a second opening located in proximity to the second end ring.

17. A magnetic resonance imaging (MRI) system comprising:
- a superconducting magnet installed in a cryostat;
- a gradient coil assembly disposed within an inner diameter of the superconducting magnet; and
- a radio frequency (RF) coil disposed within an inner diameter of the gradient coil assembly, the RF coil comprising:
  - a first end ring;
  - a second end ring; and
  - a plurality of rungs electrically coupled between the first and second end rings, each rung including a first rung portion formed from a first plurality of insulated conductors, a second rung portion formed from a single solid conductor, and a third rung portion formed from a second plurality of insulated conductors, the second rung portion coupled in series between the first and third rung portions, wherein the first plurality and second plurality of insulated conductors each include a group of wire conductors that are individually encased along a length by an electrical insulation material.

18. The MRI system of claim 17 wherein the wire conductors of at least one of the first and second plurality of insulated conductors are braided together.

19. The MRI system of claim 17 wherein the plurality of insulated conductors forming the first and third portions are positioned parallel to one another, each of the plurality of insulated conductors having a circular cross sectional profile.

20. The MRI system of claim 17 wherein the first end ring, the second end ring, and the plurality of rungs are coupled together to form a birdcage coil.

* * * * *